April 15, 1969 R. H. LANZL ET AL 3,439,235

EPOXY ENCAPSULATED SEMICONDUCTOR DEVICE

Filed Nov. 14, 1966

INVENTORS:
ROBERT H. LANZL,
HAROLD R. LEE,
BY Robert J. Mooney
THEIR ATTORNEY.

3,439,235
EPOXY ENCAPSULATED SEMICONDUCTOR DEVICE

Robert H. Lanzl, Baldwinsville, and Harold R. Lee, Auburn, N.Y., assignors to General Electric Company, a corporation of New York Filed Nov. 14, 1966, Ser. No. 593,899
Int. Cl. H01l 1/02, 3/00, 5/00
U.S. Cl. 317—234 5 Claims

ABSTRACT OF THE DISCLOSURE

A semiconductor device comprising a body of semiconductor material; metallic contacts on said body; metallic leads electrically connected to said contacts; a filled epoxy platform header through which said leads extend, and a filled epoxy encapsulant surrounding and enclosing said semiconductor body and a portion of said leads and contiguous with one major face of said header.

This invention relates to improvements in semiconductor devices including a body of semiconductor material having contact areas connected to external leads, and enclosed in a plastic encapsulant formed contiguous with a plastic platform header through which the leads extend and by which the leads are spaced. More particularly, the invention relates to such devices of which the encapsulant and header are characterized by ability to withstand sustained operation in high ambient temperatures of up to 200° C., as well as extreme resistance to penetration of moisture under high humidity conditions.

Semiconductor devices such as transistors are known in which a body or pellet of semiconductor material is mounted on a metallic member which may serve as all or part of the electrical connector or external lead from one of the functionally significant regions of the semiconductor body, such as the transistor emitter or base or collector region. Other electrical connectors such as wires or other electrically conductive members are connected to the other functionally significant regions of the pellet, and may in turn be attached to, or may themselves constitute, additional external electrical leads of the device. The external leads extend through a header of electrically insulative plastic material such as a disc or platform of resinous material. Such header serves to support, space and orient the leads, both prior to complete assembly of the device as well as afterward. The assemblage, including the pellet and at least a portion of the electrical connectors thereto, is encapsulated, for example by casting or moulding, in a suitable electrically insulative material such as a thermosetting plastic resinous composition, which is contiguous with one major face of the header.

Although the semiconductor pellet in such devices is frequently of the type wherein its electrically significant regions are at least partly protected from contamination by moisture and other environmental impurities by a protective coating carried directly by the semiconductor material itself, such as a thin layer of an oxide of silicon in the case of a silicon pellet, the encapsulation and the header provides further permanent protection against mechanical and thermal shock, chemical attack or the like, and ruggedizes the device so as to simplify subsequent handling, packaging, shipping and use.

A problem which has been encountered with such devices has been that of penetration of the encapsulant and header by moisture under prolonged high humidity conditions, causing undesirable electrical leakage currents and otherwise adversely affecting the electrical characteristics of the device. It has been found that this water permeability problem is not fully controlled by improvement of the encapsulant alone without a corresponding reduction in moisture permeability through the header. Although elimination of the header entirely from the completed device has been considered as one means of reducing this moisture problem, the header has particular utility, including that of supporting and orienting the leads during manufacture, and hence its elimination is undesirable. The need for extremely low cost pre-fabrication of the header assembly, i.e. the header itself and the leads which extend through it, makes desirable the use of a header material of a different composition from that of the encapsulant enclosing the semiconductor body, and hence complicates the problem of providing a satisfactory combination of header material and encapsulant material which are fully compatible, yet provide the desired moisture imperviousness and temperature stability.

Accordingly, one object of the present invention is to provide improved semiconductor devices of the foregoing type having an improved combination of encapsulant and header affording excellent resistance to moisture permeability, even under prolonged exposure to high humidity conditions of up to 100% relative humidity.

Another object is to provide improved junction semiconductor devices of the foregoing character wherein the foregoing advantages are obtained with a minimum addition to the cost of the device and with a minimum of change or disruption of process or assembly steps heretofore employed in the manufacture of such devices.

Another object is to provide a low cost semi-conductor device of the foregoing type having an epoxy resinous header and encapsulant capable of withstanding temperatures up to 200° C. without degradation or deleterious effect on the electrical characteristics of the device.

These and other objects of the invention will be apparent from the following description and the accompanying drawing wherein.

Figure 1:
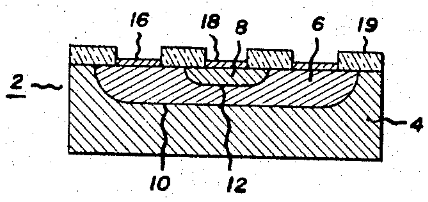
FIGURE 1 is an enlarged sectional view of a semiconductor body or pellet portion of one type of electronic component to which the present invention is particularly applicable.
Figure 2:
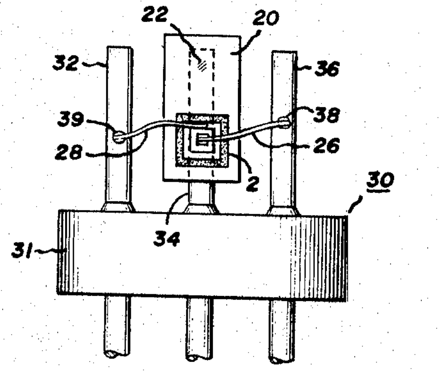
FIGURE 2 is a fragmentary view of a semiconductor device utilizing the pellet of FIGURE 1 and to which the present invention is particularly applicable, at an intermediate stage of manufacture of such semiconductor device.
Figure 3:
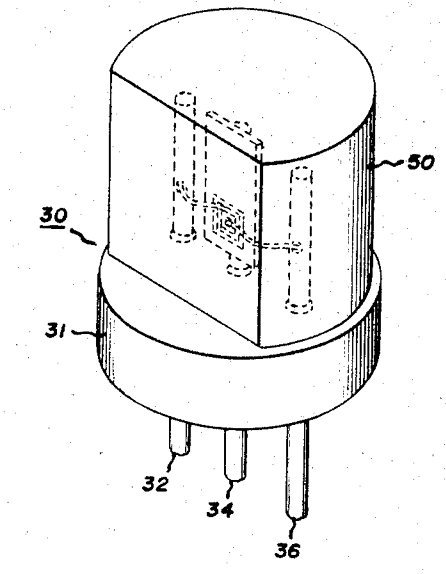
FIGURE 3 is a perspective view showing the structure of FIGURE 2 after manufacture is completed according to the present invention.

Referring to the drawing, it will be appreciated that the present invention is applicable to a variety of semiconductor devices, but is illustrated for convenience and by way of example as applied to a transistor. As constructed in accordance with the present invention, the transistor shown includes an electrically active element consisting of a body or pellet 2 of semiconductor material such as silicon, of wafer-like form having a thickness of, for example, 5 to 8 mils and having an area of, for example, 100 to 400 square mils. The pellet has a plurality of electrically active regions which may include, for example, a collector region 4, base region 6, and emitter region 8. The pellet may be suitably treated with additives or impurities, for example, by impurity diffusion, so that the base region 6 is of opposite conductivity type to that of the emitter region 8 and collector region 4, thus defining a pair of PN junctions, indicated generally at 10 and 12, within the pellet. The pellet may include, for example, a collector region 4 of N-type silicon, a P-type base region 6 formed by diffusion into the pellet of an impurity such as boron, and an N-type emitter region 8 formed by diffusion into the base region of an impurity such as phosphorus. Conductive coatings, for example of aluminum or other suitable metal of metallic material, are applied to the base and emitter regions, respectively, to form non-rectifying contacts 16, 18 facilitating attachment of respective leads thereto. At the surface of the pellet, between the emitter and base contacts 16, 18 and over the intersection of the loci of the junctions 10, 12 with the pellet surface, the pellet is provided with a protective covering 19 of insulative material, which in the case of a silicon pellet may conveniently consist of an oxide of the silicon.

The pellet is mounted on a carrier 20 which may consist, for example, of Kovar or steel, having a ribbon-like cross section of, for example, 50 mils in width and 5 to 10 mils in thickness. The major face of the pellet opposite that of the base and emitter contact regions 16, 18 is permanently conductively secured to carrier 20 as, for example, by soldering or welding to provide a non-rectifying conductive contact. To facilitate the attachment of the pellet to the carrier, an intermediate layer of a metal, such as gold or gold doped with an impurity of the same conductivity type as the collector region of the pellet, may be employed to form a solder between the carrier 20 and the pellet 2.

An emitter lead 26, such as an elongated metallic member of gold or other suitable metal having a cross-section of the order of 1 square mil, is permanently joined at one of its ends in non-rectifying electrical contact to the emitter contact 18 of the pellet. A similar base lead 28 is likewise permanently joined to the base contact 16.

The carrier 20 is mechanically and electrically conductively attached as by a weld 22 to the center post 34 of a header assembly 30 including a platform or disk-shaped header 31 of electrically insulative plastic material through which the center post 34 extends. Likewise extending through the header 31 are side posts 32 and 36 to which the base lead 28 and emitter lead 26 are respectively secured as by welds 39, 38. The header 31 serves as a support for maintaining the spacing and relative position of the external leads constituted by the three posts 32, 34 and 36.

The header 31 is formed from a header material which, according to the present invention, is an epoxy resinous composition including an epoxy resin filled with about 50 to 70% by weight of thermal conductivity improving material consisting of particulate silica and glass fibers. The epoxy composition includes an epoxy resin having an epoxide equivalent weight of about 220–250 and a softening point of about Duran 220° C. Preferably the silica particles are of globular shape, such as novacite silica. The glass fibers particularly enhance the thermal conductivity of the epoxy compound and preferably have a length of about .030 inch and a diameter of about .005 inch. The epoxy composition may be conveniently handled as a granulated molding compound. The epoxy resin is cross-linked with an acid anhydride curing agent. A catalyst is used to accelerate curing of the header resin, and a preferred form of the catalyst is one having an extremely low amine content such as to minimize formation of ammonium-hydroxide in the presence of water. One such suitable filled epoxy compound is that available commercially as Epiall 1906–L from Allied Chemical Corporation, Copiague, Long Island, N.Y.

In the application of the header material, the granulated molding compound is heated to about 290°–350° C. to convert it to a viscous fluid, following which it is pressure molded around the lead wires 32, 34 and 36 in any suitable manner, such as by conventional compression molding or transfer molding techniques. After suitably curing in the mold at a temperature of about 290°–350° C. for a time of the order of one minute, long enough to produce sufficient hot strength of the molded header to permit its removal from the mold without damage, the partially cured header assembly is removed from the mold.

After removal from the mold, further curing of the header may be accelerated by baking for a few hours at a temperature of about 200° C.

The semiconductor pellet 2 and the portion of its leads adjacent thereto are encapsulated in an electrically insulative and thermally conductive encapsulant 50. In combination with the header material above described, a preferred encapsulant, according to the present invention, consists of an unmodified novolac epoxy resin having an epoxide equivalent weight of about 175, a softening point of about 210° C., a viscosity of about 30,000 to 90,000 centipoise at 52° C., and a specific gravity of about 1.22, such as the resin available commercially as D.E.N. 438 from the Dow Chemical Company, Midland, Mich., or that available commercially as Epotuf 37–170 from Reichhold Chemical, Inc., White Plains, N.Y. The resin of encapsulant 50 is crosslinked with a blended curing agent consisting of a mixture of nadic methyl anhydride ($C_{10}H_{10}O_3$), and hexahydrophthalic anhydride ($C_8H_{10}O_3$), both available commercially from Allied Chemical Company, New York. A catalyst is used to accelerate curing. A preferred form of catalyst is one having no amines, such as to minimize formation of ammonium hydroxide in the presence of water. A preferred catalyst is one containing zinc octoate and triphenyl phosphite, such as that available commercially as Argus DB VIII from the Argus Chemical Corporation, Brooklyn, N.Y. Also, if desired, the encapsulant may be rendered opaque by addition of a suitable coloring material such as powdered black pigment, for example that available commercially as F–6331 from Ferro Corporation, Cleveland, Ohio. To enhance its thermal conductivity and reduce the amount of resin required for a given volume, the encapsulant may also include a chemically non-reactive electrically insulative filler of particulate material, such as powdered alumina, preferably of tabular or platelet-like particulate form, available commercially as Tabular Alumina T–61 from Aluminum Company of America.

A satisfactory formulation for the encapsulant 50 is shown in Column A of the following table:

| Ingredient | Percent by weight | |
|---|---|---|
| | Column A | Column B |
| Novolac epoxy resin (D.E.N. 438) | 15–20 | 55–65 |
| Curing agent, nadic methyl anhydride | 1.2–1.8 | 4–6 |
| Curing agent, hexahydrophthalic anhydride | 8–11 | 28–37 |
| Blended catalyst, Argus DB VIII | 0.8–1.0 | 2.8–3.4 |
| Filler, tabular alumina T–61 | 50–75 | ----------- |
| Coloring material, Ferro F–6331 | 0.5–1.5 | ----------- |

A preferred form of composition for the encapsulant 50 may be compounded in a manner which will now be described:

*Step 1.*—17.1 parts by weight of the novolac epoxy resin, which has been preheated to 105° C. for at least two hours, are placed in a suitable container, such as a stainless steel pot or disposable paper container.

*Step 2.*—To the resin is then added 0.9 part by weight of the catalyst Argus DB VIII.

*Step 3.*—The foregoing ingredients are mixed at a temperature of 105° C. for a time sufficient to insure thorough blending, such as a few minutes.

*Step 4.*—To the foregoing mixture is added 1.5 parts by weight of nadic methyl anhydride curing agent.

*Step 5.*—Add 9.5 parts by weight of hexahydrophthalic anhydride curing agent.

*Step 6.*—Mix the foregoing ingredients at a temperature of 105° C. for a time sufficient to insure thorough blending, such as a few minutes.

*Step 7.*—To the foregoing mixture add 1.0 part by weight of pigment F–6331 and 70.0 parts by weight of the T–61 tabular alumina filler which has previously been suitably dehydrated as by drying in air at 105° C. for at least 16 hours.

*Step 8.*—Mix the foregoing ingredients sufficiently to insure thorough blending.

The resulting mixture is a viscous liquid which is ready for immediate application to a mold, or may be preserved for future use by refrigerating at a temperature of about −5° F. to postpone curing, at which temperature the shelf life of the mixture is at least three months.

An alternative form of encapsulant 50, without the filler and with or without the coloring material as desired, may be prepared by mixing according to the first six of the eight above-described steps the ingredients as shown in column B of the foregoing table.

An exemplary application of the encapsulant 50 to a semiconductor device pellet and leads to be encapsulated will now be described:

*Step 1.*—A suitable mold, which may be made, for example, of silicone rubber, is preheated for at least 20 minutes at a temperature of, for example, 125° C.

*Step 2.*—A suitable quantity of the uncured epoxy encapsulant, formulated as hereinabove described, is preheated for a time sufficient to bring it to a uniform temperature of about 125° C.

*Step 3.*—The structure to be encapsulated is placed within the mold and the preheated encapsulant is introduced into the mold in a quantity sufficient to fill the mold.

*Step 4.*—The encapsulant is cured in the mold at a temperature of about 125° C. for a time, such as about 1 to 2½ hours, long enough to produce sufficient gelling of the encapsulant to permit removal from the mold without damage to the mold or molded structure. If desired, during the initial portion of such cure, a vacuum may be drawn on the encapsulant to remove entrapped air or other bubbles.

*Step 5.*—The partially cured encapsulant structure is removed from the mold.

*Step 6.*—Curing of the encapsulant is completed after removal from the mold, by baking for about 16 hours at a temperature in the range of 180°–230° C.

To maximize the temperature at which the resulting encapsulant 50 is stable, it is desirable to employ as high a final cure temperature as possible without deleteriously affecting the encapsulant 50. Hence final cure temperatures of up to 230° C. may be employed for such purpose.

Either of the formulations of encapsulant 50 defined in column A or column B of the foregoing table may be applied alternatively in accordance with known transfer molding techniques by preliminarily mixing a batch of the encapsulating material as above described, allowing the resulting compound to gell without exceeding polymerizing temperatures, and then reducing the resulting solid mass to a finely divided or particulate form suitable for use with conventional transfer molding equipment and techniques.

Figure 4:
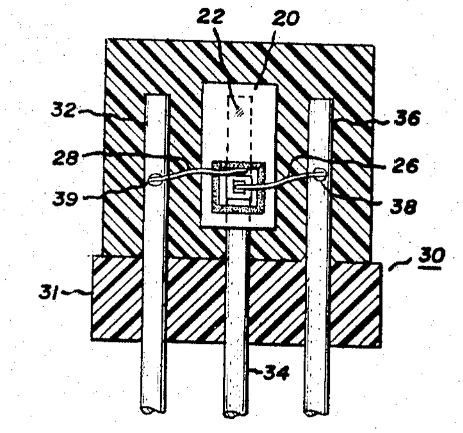
FIGURE 4 is an enlarged fragmentary sectional view of a portion of the structure of FIGURE 3.

The remarkable advantages of a semiconductor device having a header 31 and encapsulant 50 such as above described, in comparison with prior art plastic encapsulated semiconductor devices, may be appreciated from the fact that transistors such as shown in FIGURE 4 and made according to the present invention, after being stored in an environment with relative humidity of 100% at 40° C. for 5,000 hours in a non-energized condition, exhibited extremely low increases in leakage current, i.e. collector junction reverse current $I_{CES}$. For example, such transistors when energized after such prolonged high humidity storage showed a leakage current $I_{CES}$ of only about .06 nanoampere with a 20-volt potential connected between the collector and the tied-together emitter and base, which is essentially a zero increase from the value of such leakage current before such test. This compares with prior art plastic encapsulated transistors which under similar test conditions exhibit increases in leakage currents $I_{CES}$ of four to five orders of magnitude. Therefore, while preserving all of the low cost advantages which make prior art plastic encapsulated semiconductor devices so attractive for the consumer market, the present invention provides devices which are capable of meeting additionally the far more stringent high ambient temperature toleration and moisture permeability-resistant requirements of certain industrial and military applications.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. A semiconductor device comprising a body of semiconductor material, metallic contacts on said body, metallic leads electrically connected to said contacts, a platform header through which said metallic leads extend, said header comprising an epoxy resinous composition including an epoxy resin having an epoxide equivalent weight of about 220–250 and a filling of electrically insulative material, and an encapsulant surrounding and enclosing said semiconductor body and a portion of said leads and contiguous with one major face of said header, said encapsulant comprising an epoxy resinous composition including a novalac epoxy resin having an epoxide equivalent weight of about 175–182 and including a filler of about 50–75% by weight of a particulate electrically insulative material.

2. A semiconductor device as defined in claim 1 wherein the filling of said header composition constitutes from 50 to 75% by weight of said header composition.

3. A semiconductor device as defined in claim 1 wherein said header composition filling includes a mixture of particulate silica and glass fibers.

4. A header assembly for a semiconductor device comprising a plurality of metallic leads adapted to be electrically connected to respective contacts of a semiconductor body, a platform header through which said leads extend and by which said leads are supported and spaced, said header having a face adapted to be contiguous with an encapsulant enclosing a semiconductor body connected to said leads, said header comprising an epoxy resinous composition including an epoxy resin having an epoxide equivalent weight of about 220–250 and a filling of electrically insulative material.

5. A header assembly as defined in claim 4 wherein said header composition filling constitutes from 50 to 70% by weight of said header composition and includes a mixture of particulate silica and glass fibers.

References Cited

UNITED STATES PATENTS

| | | | |
|---|---|---|---|
| 2,937,110 | 5/1960 | John | 317—235 X |
| 3,264,248 | 8/1966 | Lee | 260—30.6 |

JOHN W. HUCKERT, *Primary Examiner.*

R. F. POLISSACK, *Assistant Examiner.*

U.S. Cl. X.R.

317—235; 29—588, 589, 590